United States Patent
Heo

(10) Patent No.: US 6,946,323 B1
(45) Date of Patent: Sep. 20, 2005

(54) SEMICONDUCTOR PACKAGE HAVING ONE OR MORE DIE STACKED ON A PREPACKAGED DEVICE AND METHOD THEREFOR

(75) Inventor: Young Wook Heo, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/831,505

(22) Filed: Apr. 22, 2004

Related U.S. Application Data

(62) Division of application No. 10/000,923, filed on Nov. 2, 2001, now abandoned.

(51) Int. Cl.[7] ........................ H01L 21/48; H01L 21/50
(52) U.S. Cl. ....................................... 438/109; 438/127
(58) Field of Search ................................ 438/106, 107, 438/108, 109, 110, 112, 124, 125, 126, 127

(56) References Cited

U.S. PATENT DOCUMENTS

| | | |
|---|---|---|
| 4,763,188 A | 8/1988 | Johnson |
| 5,012,323 A | 4/1991 | Farnworth |
| 5,025,306 A | 6/1991 | Johnson et al. |
| 5,291,061 A | 3/1994 | Ball |
| 5,323,060 A | 6/1994 | Fogal et al. |
| 5,347,429 A | 9/1994 | Kohno et al. |
| 5,422,435 A | 6/1995 | Takiar et al. |
| 5,463,253 A | 10/1995 | Waki et al. |
| 5,495,398 A | 2/1996 | Takiar et al. |
| 5,502,289 A | 3/1996 | Takiar et al. |
| 5,689,135 A | 11/1997 | Ball |
| 5,696,031 A | 12/1997 | Wark |
| 5,715,147 A | 2/1998 | Nagano |
| 5,721,452 A | 2/1998 | Fogal et al. |
| 5,739,581 A | 4/1998 | Chillara et al. |
| 5,815,372 A | 9/1998 | Gallas |
| 5,866,949 A | 2/1999 | Schueller |
| 5,886,412 A | 3/1999 | Fogal et al. |
| 5,973,403 A | 10/1999 | Wark |
| 6,005,778 A | 12/1999 | Spielberger et al. |
| 6,013,948 A | 1/2000 | Akram et al. |
| RE36,613 E | 3/2000 | Ball |
| 6,051,886 A | 4/2000 | Fogal et al. |
| 6,057,598 A | 5/2000 | Payne et al. |
| 6,072,243 A | 6/2000 | Nakanishi |
| 6,080,264 A | 6/2000 | Ball |
| 6,118,176 A | 9/2000 | Tao et al. |

(Continued)

FOREIGN PATENT DOCUMENTS

EP 0 503 201 A2 12/1991

(Continued)

OTHER PUBLICATIONS

"Stacked Module Package (SMP): A Novel IC Package for Products with Mixed Logic and Memory Die" ChipPAC, Incorporated and Qualcomm CDMA Technologies, Mar. 2, 2004.

*Primary Examiner*—Michael Lebentritt
*Assistant Examiner*—Scott B. Geyer
(74) *Attorney, Agent, or Firm*—Gunnison, McKay & Hodgson, L.L.P.; Serge J. Hodgson

(57) ABSTRACT

A semiconductor package and method for producing the same has a substrate. A prepackaged semiconductor device is coupled to the substrate. At least one die is coupled to a top surface of the prepackaged semiconductor device. An adhesive layer is laid between the prepackaged semiconductor device and the first die to coupled the two together. A mold compound is then used to encapsulate the semiconductor package.

21 Claims, 3 Drawing Sheets

U.S. PATENT DOCUMENTS

| | | |
|---|---|---|
| 6,133,637 A | 10/2000 | Hikita et al. |
| 6,140,149 A | 10/2000 | Wark |
| 6,157,080 A | 12/2000 | Tamaki et al. |
| 6,163,076 A | 12/2000 | Lee et al. |
| 6,180,881 B1 | 1/2001 | Isaak |
| 6,214,641 B1 | 4/2001 | Akram |
| 6,215,193 B1 | 4/2001 | Tao et al. |
| 6,251,695 B1 * | 6/2001 | Kwon .................... 438/14 |
| 6,252,305 B1 | 6/2001 | Lin et al. |
| 6,258,626 B1 | 7/2001 | Wang et al. |
| 6,326,696 B1 | 12/2001 | Horton et al. |
| 6,333,562 B1 | 12/2001 | Lin |
| 6,339,255 B1 | 1/2002 | Shin |
| 6,359,340 B1 | 3/2002 | Lin et al. |
| 6,365,966 B1 | 4/2002 | Chen et al. |
| 6,387,728 B1 | 5/2002 | Pai et al. |
| 6,461,897 B2 | 10/2002 | Lin et al. |
| 6,472,741 B1 | 10/2002 | Chen et al. |
| 6,500,698 B2 | 12/2002 | Shin |
| 6,607,937 B1 * | 8/2003 | Corisis ................ 438/108 |
| 6,800,947 B2 * | 10/2004 | Sathe .................... 257/780 |
| 2003/0155649 A1 | 8/2003 | Wood et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |

FOREIGN PATENT DOCUMENTS

| | | |
|---|---|---|
| JP | 56062351 | 5/1981 |
| JP | 60182731 | 9/1985 |
| JP | 61117858 | 6/1986 |
| JP | 62-126661 | 6/1987 |
| JP | 63128736 | 6/1988 |
| JP | 63-244654 | 10/1988 |
| JP | 1028856 | 1/1989 |
| JP | 64001269 | 1/1989 |
| JP | 1071162 | 3/1989 |
| JP | 1099248 | 4/1989 |
| JP | 3169062 | 7/1991 |
| JP | 4028260 | 1/1992 |
| JP | 4-56262 | 2/1992 |
| JP | 4096358 | 3/1992 |
| JP | 4116859 | 4/1992 |
| JP | 5013665 | 1/1993 |
| JP | 5-75015 | 3/1993 |
| JP | 5109975 | 4/1993 |
| JP | 5136323 | 6/1993 |
| JP | 10-256470 | 9/1998 |

* cited by examiner

SEMICONDUCTOR PACKAGE HAVING ONE OR MORE DIE STACKED ON A PREPACKAGED DEVICE AND METHOD THEREFOR

CROSS REFERENCE TO RELATED APPLICATION

This application is a division of U.S. patent application Ser. No. 10/000,923, filed on Nov. 2, 2001, now abandoned.

FIELD OF THE INVENTION

This invention relates to semiconductor devices and, more specifically, to a semiconductor package which has one or more die stacked on a pre-packaged device and a method therefor.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die vertically in an IC package. Currently, die stacking with flash memory, Static Random Access Memory (SRAM), logic and/or Application Specific Integrated Circuit (ASIC) devices have been introduced for increasing the density of chip integration.

In order to provide high quality multi-chip stacked devices, the devices used for stacking must be either high yield FAB (i.e., memory devices) or known good die (KGD). Certain devices, like ASIC and logic devices, have a lower yield than devices like memory. Thus, these types of devices need to be screened if they are to be used in a multi-chip stacked device. A problem arises in that it is expensive to get a KGD prepared. Wafer component testing and burn-in testing is a very expensive process. However, testing of these types of devices is necessary in order to sort out potentially problematic chips and to prevent any quality and reliability issues.

Presently, if a logic or ASIC device in an assembled stacked die package is rejected after testing, the good semiconductor die coupled to these rejected logic or ASIC devices must be scraped. This is problematic for many end customers due to the cost of scraping the good die.

Therefore, a need existed to provide a device and method to overcome the above problems.

SUMMARY OF THE INVENTION

A semiconductor package and method for producing the same has a substrate. A prepackaged semiconductor device is coupled to the substrate. At least one semiconductor die is coupled to the prepackaged semiconductor device. An adhesive layer is laid between the prepackaged semiconductor device and the first semiconductor die to couple the two together. A mold compound is then used to encapsulate the semiconductor package.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
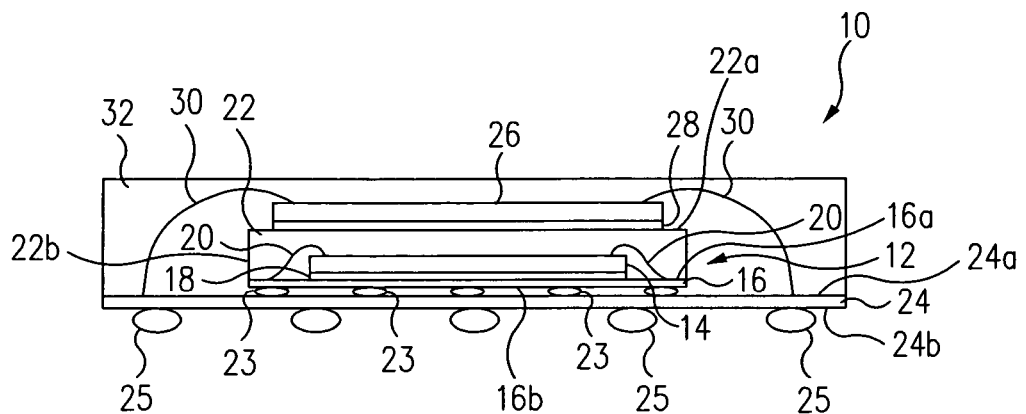
FIG. 1 is a cross-sectional side view of one embodiment of the present invention showing a semiconductor package with a single die stacked on a pre-packaged device.

Referring to FIG. 1, one embodiment of a semiconductor package 10 of the present invention is shown. The semiconductor package 10 will allow one or more die to be stacked on a known good die to ensure good electrical functionality of the semiconductor package 10.

The semiconductor package 10 has a prepackaged device 12. The prepackaged device 12 is a fully encapsulated package which has a semiconductor die 14. The semiconductor die 14 may be any type of device. For example, the semiconductor die 14 may be a memory device, a logic device, an ASIC device, and other like elements. It should be noted that the listing of types for the above semiconductor die 14 is given as an example and should not be seen as to limit the scope of the present invention. While any type of semiconductor die 14 may be used, the semiconductor die 14 is generally a type of device which has a lower manufacturing yield and which would require testing of some kind in order to sort out potentially problematic devices and to prevent any quality and reliability issues.

The semiconductor die 14 is coupled to an upper surface 16a of a substrate 16. An adhesive layer 18 is used to couple the semiconductor die 14 to the substrate 16. One or more wirebonds 20 are used to electrically connect the semiconductor device 14 to the upper surface 16a of substrate 16. A mold compound 22 is then used to encapsulate the prepackaged device 12. As shown in FIG. 1, the mold compound 32 covers the upper surface 16a of substrate 16, the semiconductor die 14, the adhesive 18, and the wirebonds 20.

In the embodiment depicted in FIG. 1, the prepackaged device 12 is a Ball Grid Array (BGA) type of package. However, this should not be seen as to limit the scope of the present invention. A leadframe type of prepackaged device 12 may be used. This embodiment will be described later.

The prepackaged device 12 is coupled to an upper surface 24a of a substrate 24. In the embodiment depicted in FIG. 1, a plurality of solder balls 23 are used to couple the prepackaged device 12 to the substrate 24. However, as stated above, the prepackaged device 12 may also be a leadframe type of device. The substrate 24 may be a tape, a laminate substrate, or the like. In the embodiment depicted in FIG. 1, a plurality of solder balls 25 are coupled to a lower, unencapsulated surface 24b of the substrate 24. The solder balls 25 will provide an electrical connection to the semiconductor package 10. However, it should be noted that other types of connections may be used. These other types of connections will be described later in another embodiment.

A semiconductor die 26 is coupled to a top section of the prepackaged device 12, in particular, to an uppermost surface 22a of the mold compound 22. The semiconductor die 26 may be any type of device. However, a memory device or a passive chip component is generally used. The semiconductor die 26 may be coupled to the prepackaged device 12 in a plurality of different ways. In general, some type of adhesive 28 is used. The adhesive 28 is placed on the surface 22a of the mold compound 22 of the prepackaged device 12. The semiconductor die 26 is then placed on top of the adhesive 28. The adhesive 28 may be an epoxy adhesive which can be either electrically or non-electrically conductive. The adhesive 28 may be an adhesive tape, a paste, or the like. A spacer and an adhesive 28 may also be used. The spacer will provide additional clearance between the prepackaged device 12 and the semiconductor die 26. The spacer is generally a silicon spacer.

Once the semiconductor die 26 is coupled to the prepackaged device 12, the semiconductor die 26 is further electrically coupled to the substrate 24. In the embodiment depicted in FIG. 1, the semiconductor die 26 is electrically coupled to the substrate 24 by wirebonding. One or more wirebonds 30 are used to electrically couple the semiconductor die 26 to the substrate 24. Once the wirebonds 30 are complete, a mold compound 32 is used to encapsulate the entire package 10. As shown in FIG. 1, the mold compound 32 covers the exterior surfaces of the prepackaged device 12, including the upper surface 22a and exterior side surfaces 22b of mold compound 22, the lower surface 16b of substrate 16, and the solder balls 23, as well as the upper surface 24a of substrate 24, the semiconductor die 26, adhesive 28, and wirebonds 30.

Figure 2:
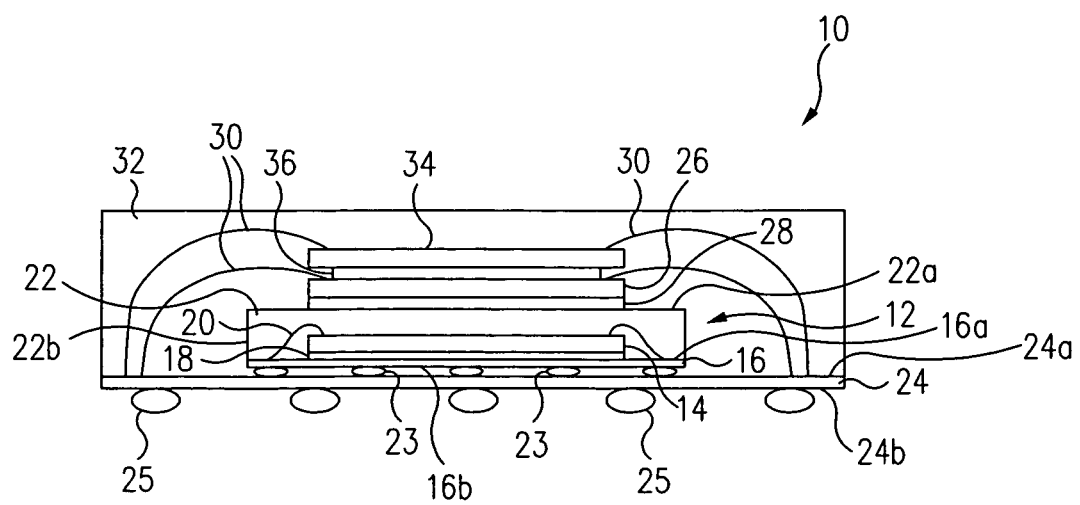
FIG. 2 is a cross-sectional side view of another embodiment of the present invention showing a semiconductor package with multiple die stacked on a prepackaged device.

Referring now to FIG. 2, another embodiment of the semiconductor package 10 of the present invention is shown. The semiconductor package 10 of FIG. 2 is similar to that shown in FIG. 1. The semiconductor package 10 has a prepackaged device 12. The prepackaged device 12 is a fully encapsulated package which has a semiconductor die 14. The semiconductor die 14 may be any type of device. The semiconductor die 14 is coupled to an upper surface 16a of a substrate 16. An adhesive layer 18 is used to couple the semiconductor die 14 to the substrate 16. One or more wirebonds 20 are used to electrically connect the semiconductor die 14 to the upper surface 16a of the substrate 16. A mold compound 22 is then used to encapsulate the prepackaged device 12.

The prepackaged device 12 is coupled to the upper surface 24a of a substrate 24. The substrate 24 may be a tape, a laminate substrate, or the like. In the embodiment depicted in FIG. 2, the prepackaged device 12 is a Ball Grid Array (BGA) type of package. A plurality of solder balls 23 are used to couple the prepackaged device 12 to the upper surface 24a of the substrate 24. However, this should not be seen as to limit the scope of the present invention. A leadframe type of prepackaged device 12 may be used. This embodiment will be described later.

A semiconductor die 26 is coupled to a top section of the prepackaged device 12, in particular to the upper surface 22a of mold compound 22. The semiconductor die 26 may be any type of device. However, a memory device or a passive chip component is generally used. The semiconductor die 26 may be coupled to the prepackaged device 12 in a plurality of different ways. In general, some type of adhesive 28 is used. The adhesive 28 is placed on the upper surface 22a of the mold compound 22 of the prepackaged device 12. The semiconductor die 26 is then placed on top of the adhesive 28. The adhesive 28 may be an epoxy adhesive which can be either electrically or non-electrically conductive. The adhesive 28 may be an adhesive tape, a paste, or the like. A spacer and an adhesive 28 may also be used to provide additional clearance between the prepackaged device 12 and the semiconductor die 26. The spacer is generally a silicon spacer.

Once the semiconductor die 26 is coupled to the prepackaged device 12, the die 26 is further electrically coupled to the upper surface 24a of the substrate 24. In the embodiment depicted in FIG. 1, the semiconductor die 26 is electrically coupled to the substrate 24 by wirebonding. One or more wirebonds 30 are used to electrically couple the semiconductor die 26 to the substrate 24.

A second semiconductor die 34 is coupled to a top surface of the first semiconductor die 26. The second semiconductor die 34 may be any type of device. However, a memory device or a passive chip component is generally used. In the embodiment depicted in FIG. 2, the second semiconductor die 34 is approximately the same size as the first die 26. The second semiconductor die 34 may be coupled to the first semiconductor die 26 in a plurality of different ways. In general, some type of adhesive 36 is used. The adhesive 36 is placed on the top surface of the first semiconductor die 26. The second semiconductor die 34 is then placed on top of the adhesive 36. The adhesive 36 may be an epoxy adhesive which can be either electrically or non-electrically conductive. The adhesive 36 may be an adhesive tape, a paste, or the like. A spacer and an adhesive 36 may also be used to provide additional clearance between the prepackaged device 12 and the semiconductor die 26. The spacer is generally a silicon spacer. The thickness of the adhesive 36 has to be of a sufficient height so that the wirebonds 30 do not come in contact with the second semiconductor die 34.

Once the second semiconductor die 34 is coupled to the first semiconductor die 26, the second semiconductor die 34 is further electrically coupled to the upper surface 24a of the substrate 24. In the embodiment depicted in FIG. 2, the second semiconductor die 34 is electrically coupled to the substrate 24 by wirebonding. One or more wirebonds 30 are used to electrically couple the second semiconductor die 34 to the substrate 24.

Additional die may be place on top of the second die 34. The additional die would be attached in the same manner as described above. Again, a sufficient amount of space must be had between dies so that the wirebond 30 of a lower die does not come in contact with a die directly above. Once the wirebonds 30, of the final stacked die is complete, the entire package 10 is encapsulated using a mold compound 32. As shown in FIG. 2, the mold compound 32 covers the exterior surfaces of the prepackaged device 12, including the upper surface 22a and exterior side surface 22b of mold compound 22, the lower surface 16b of substrate 16, and the solder balls 23, as well as the upper surface 24a of substrate 24, the semiconductor dies 26 and 34, adhesive 28, and wirebonds 30.

Figure 3:
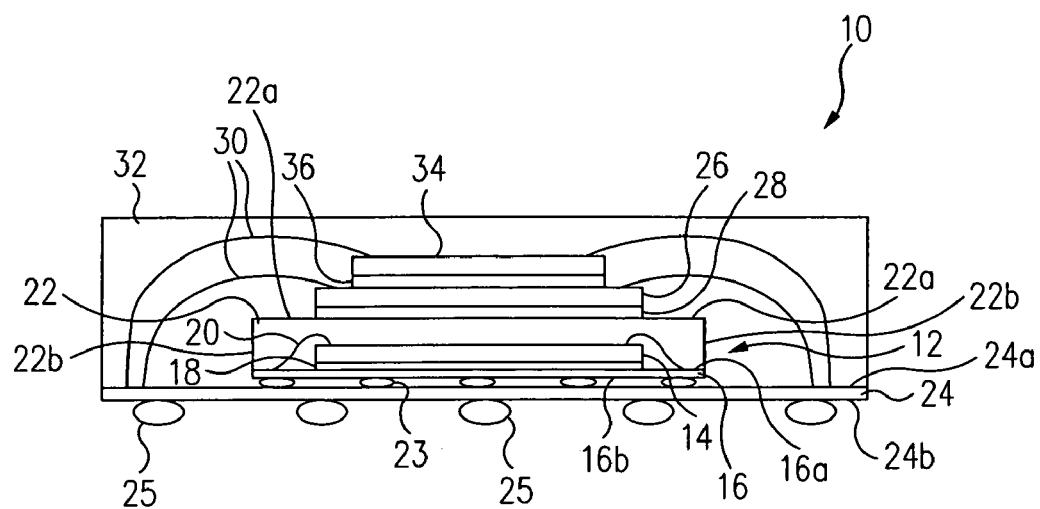
FIG. 3 is a cross-sectional side view of another embodiment of the present invention showing a semiconductor package with different size die stacked on a prepackaged device.

Referring now to FIG. 3, another embodiment of the semiconductor package 10 of the present invention is shown. The semiconductor package 10 of FIG. 3 is similar to that shown in FIG. 2. The only difference is that the second semiconductor die 34 is a different size from that of the first semiconductor die 24.

Figure 4:
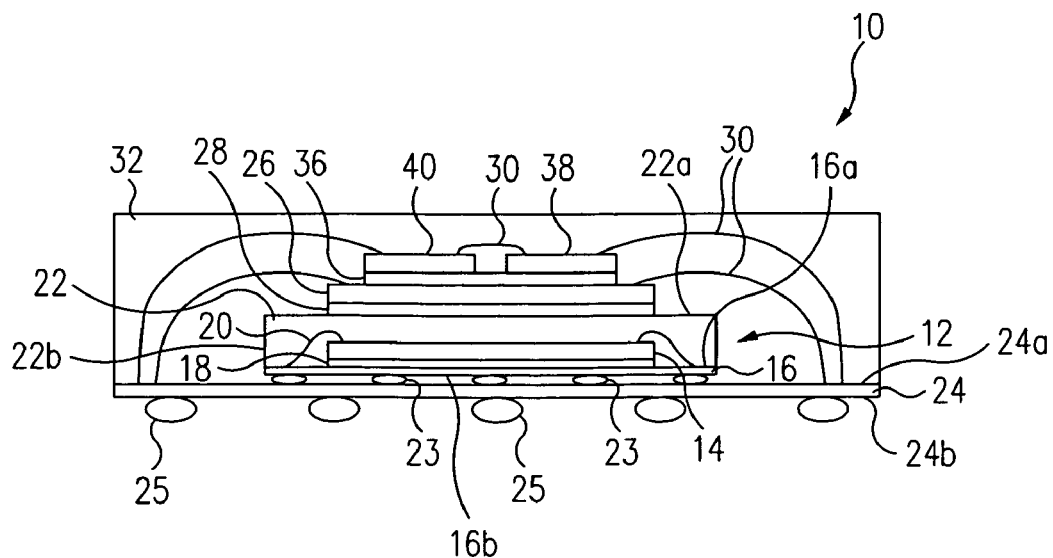
FIG. 4 is a cross-sectional side view of another embodiment of the present invention showing a semiconductor package with different size die stacked horizontally on a prepackaged device.

Referring now to FIG. 4, another embodiment of the semiconductor package 10 of the present invention is shown. The semiconductor package 10 of FIG. 4 is similar to that shown in FIGS. 2 and 3. The main difference is that the second semiconductor die 34 has been replaced with two smaller semiconductor dies 38 and 40. The two smaller semiconductor dies 38 and 40 are placed next to one another (i.e., horizontally stacked) and are on top of the first semiconductor die 26. The two semiconductor dies 38 and 40 are coupled to the first semiconductor die 26 in a manner as previously discussed above. Wirebonds 30 are used to coupled the semiconductor dies 38 and 40 to the substrate 24. Wirebonds are further used to coupled the semiconductor dies 38 and 40 to one another. Once the wirebonds 30 are complete, the entire semiconductor package 10 is encapsulated.

Figure 5:
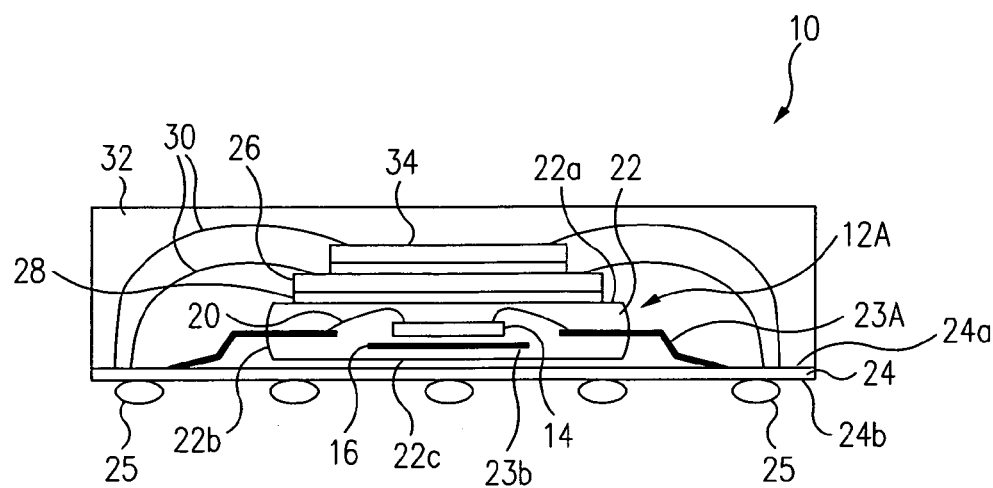
FIG. 5 is a cross-sectional side view of another embodiment of the present invention showing a semiconductor package with die stacked on a leadframe prepackaged device.

Referring now to FIG. 5, another embodiment of the semiconductor package 10 of the present invention is shown. In this embodiment, the prepackaged device 12 is a leadframe prepackaged device 12A. The leadframe prepackaged device 12A includes a substrate 16 with a plurality of leads 23A and a die pad 23B. The semiconductor die 14 is electrically connected to the leads 23A by wirebonds 20. The leads 23A are used to couple the leadframe prepackaged device 12A to the upper surface 24a of the substrate 24. In any of the previous embodiments, the prepackaged device 12 may be a BGA prepackaged device 12 as shown in the FIGS. 1–4 or a leadframe prepackaged device 12A as shown in FIG. 5. The mold compound 22 of the prepackaged device 12A has a lower surface 22c that faces upper surface 24a of substrate 24, with mold compound 22 between them.

Figure 6:
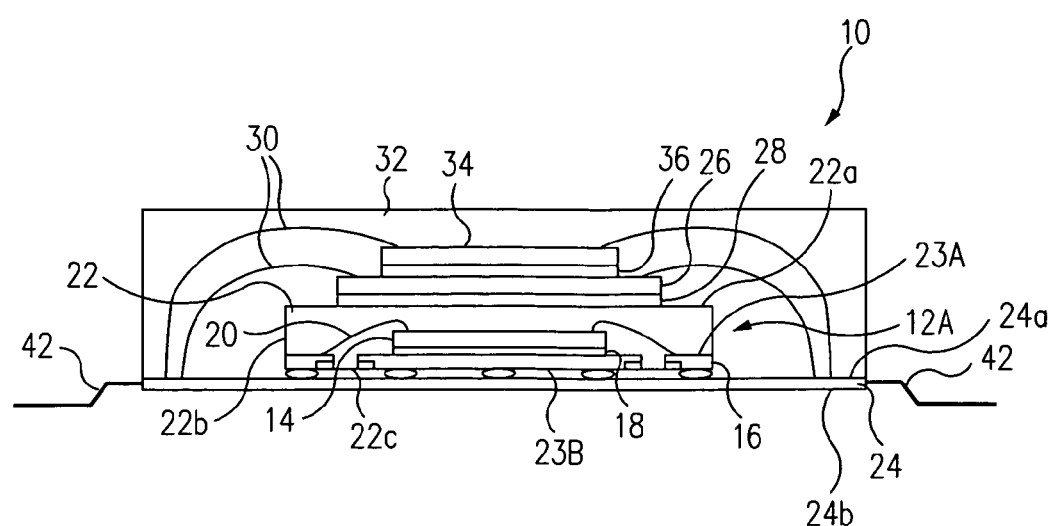
FIG. 6 is a cross-sectional side view of another embodiment of the present invention showing a semiconductor leadframe package with die stacked on a prepackaged leadframe device.

Referring now to FIG. 6, another embodiment of the semiconductor package 10 of the present invention is shown. In this embodiment, the semiconductor package 10 is a leadframe type of package. Prepackaged device 12A includes a substrate 16 that includes leads 23A and a die pad 23B. Leads 23A are electrically connected to semiconductor die 14 by wirebonds 20. Leads 23A are electrically connected to upper surface 24a of substrate 24 by solder balls 23. One or more leads 42 are used to provide electrical contact with the semiconductor package 10. In any of the previous embodiments, the semiconductor package 10 may be a BGA package as shown in the FIGS. 1–5 or a leadframe package as shown in FIG. 6.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of making a semiconductor device, comprising:

providing a prepackaged semiconductor device comprising a first substrate having a first side and an opposite second side, a first semiconductor die coupled to the first substrate, a plurality of first conductors electrically connecting the first semiconductor die to the first side of the first substrate, and a first encapsulant material covering the first side of the first substrate, the first semiconductor die, and the plurality of first conductors, the first encapsulant material having a first exterior surface opposite the first side of the first substrate;

providing a second substrate having a first side and a second side;

mounting the prepackaged semiconductor device on the first side of the second substrate, and electrically connecting the second side of the first substrate of the prepackaged semiconductor device to the first side of the second substrate, whereby the first semiconductor die of the prepackaged semiconductor device is electrically connected to the second substrate through the first substrate;

stacking a second semiconductor die on the first exterior surface of the first encapsulant material;

electrically connecting the second semiconductor die to the first side of the second substrate outward of the prepackaged semiconductor device with at least one second conductor;

covering the prepackaged semiconductor device, the first side of the second substrate, the second semiconductor die, and the at least one second conductor with a second encapsulant material by molding;

stacking a third semiconductor die on the second semiconductor die;

electrically connecting the third semiconductor die to the first side of the second substrate outward of the prepackaged semiconductor device with at least one third conductor; and covering the third semiconductor die and the at least one third conductor with the second encapsulant material.

2. The method of claim 1 wherein the second substrate has a plurality of electrically conductive interconnects at its second side.

3. The method of claim 1, further comprising:

stacking a fourth semiconductor die on the second semiconductor die;

electrically connecting the fourth semiconductor die to the first side of the second substrate outward of the prepackaged semiconductor device with at least one fourth conductor; and covering the fourth semiconductor die and the at least one fourth conductor with the second encapsulant material.

4. The method of claim 3, further comprising electrically connecting the third and fourth semiconductor dies.

5. The method of claim 1, wherein the second substrate is selected from a group consisting of a laminate substrate and a tape substrate.

6. The method of claim 5, wherein the prepackaged semiconductor device is a ball grid array package.

7. The method of claim 5, wherein the first substrate of the prepackaged semiconductor device is a metal leadframe.

8. The method of claim 1, wherein the prepackaged semiconductor device is a ball grid array package.

9. The method of claim 1, wherein the first substrate of the prepackaged semiconductor device is a metal leadframe.

10. The method of claim 1, wherein the second substrate is a metal leadframe.

11. The method of claim 1, wherein the molding includes disposing a portion of the second encapsulant material between the second side of the first substrate of the prepackaged semiconductor device and the first side of the second substrate.

12. The method of claim 11, wherein the second substrate is selected from a group consisting of a laminate substrate and a tape substrate.

13. The method of claim 1, wherein the first semiconductor die is a known good die prior to the mounting.

14. The method of claim 1, wherein the prepackaged semiconductor device includes a known good die prior to the mounting.

15. The method of claim 1, wherein at least one of the first and second substrates is a metal leadframe.

16. The method of claim 1, wherein both of the first and second substrates are metal leadframes.

17. The method of claim 1, wherein at least one of the first and second substrates is selected from a group consisting of a laminate substrate and a tape substrate.

18. The method of claim 1, wherein both of the first and second substrates are selected from a group consisting of a laminate substrate and a tape substrate.

19. The method of claim 1, wherein the second semiconductor die is stacked on an exterior surface of the first encapsulant material of the prepackaged semiconductor device prior to being covered by the second encapsulant material.

20. The method of claim 1 wherein the first semiconductor die is electrically connected to the first side of the first substrate by first wirebonds, wherein the second semiconductor die is electrically connected to the first side of the second substrate using second wirebonds, and and wherein the second encapsulant material is molded over the second wirebonds.

21. The method of claim 20, wherein the second encapsulant material is molded so that a layer of the second encapsulant material is disposed between the prepackaged semiconductor device and the first side of the second substrate.

* * * * *